US012558756B2

(12) United States Patent
Xu et al.

(10) Patent No.: US 12,558,756 B2
(45) Date of Patent: Feb. 24, 2026

(54) PROFILE CONTROL DURING POLISHING OF A STACK OF ADJACENT CONDUCTIVE LAYERS

(71) Applicant: Applied Materials, Inc., Santa Clara, CA (US)

(72) Inventors: Kun Xu, Sunol, CA (US); Harry Q. Lee, Los Altos, CA (US); Benjamin Cherian, San Jose, CA (US); David Maxwell Gage, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/341,245

(22) Filed: Jun. 7, 2021

(65) Prior Publication Data
US 2021/0379721 A1 Dec. 9, 2021

Related U.S. Application Data

(60) Provisional application No. 63/036,392, filed on Jun. 8, 2020.

(51) Int. Cl.
*B24B 37/005* (2012.01)
*B24B 37/013* (2012.01)
(Continued)

(52) U.S. Cl.
CPC .......... *B24B 37/005* (2013.01); *B24B 37/013* (2013.01); *B24B 49/105* (2013.01); *H01L 21/3212* (2013.01)

(58) Field of Classification Search
CPC ... B24B 37/005; B24B 37/013; B24B 37/042; B24B 37/046; B24B 37/10;
(Continued)

(56) References Cited

U.S. PATENT DOCUMENTS 6,399,501 B2 6/2002 Birang et al.
6,878,038 B2 * 4/2005 Johansson ............... B24B 49/04
451/6
(Continued)

FOREIGN PATENT DOCUMENTS

EP 0738561 10/1996
JP 2008-503356 2/2008
(Continued)

OTHER PUBLICATIONS

Office Action in Taiwanese Appln. No. 110117205, dated Apr. 13, 2022, 19 pages (with English summary).
(Continued)

*Primary Examiner* — Monica S Carter
*Assistant Examiner* — Caleb Andrew Holizna
(74) *Attorney, Agent, or Firm* — Fish & Richardson P.C.

(57) ABSTRACT

During polishing of a stack of adjacent conductive layers on a substrate, an in-situ eddy current monitoring system measures sequence of characterizing values. A polishing rate is repeatedly calculated from the sequence of characterizing values repeatedly, one or more adjustments for one or more polishing parameters are repeatedly calculated based on a current polishing rate using a first control algorithm for an initial time period, a change in the polishing rate that meets at least one first predetermined criterion that indicates exposure of the underlying conductive layer is detected, and one or more adjustments for one or more polishing parameters are calculated based on the polishing rate using a different second control algorithm for a subsequent time period after detecting the change in the polishing rate.

20 Claims, 5 Drawing Sheets

(51) Int. Cl.
    *B24B 49/10*       (2006.01)
    *H01L 21/321*     (2006.01)

(58) Field of Classification Search
    CPC ....... B24B 49/105; B24B 49/02; B24B 49/04;
                B24B 49/10; B24B 49/12; B24B 49/16;
                                  H01L 21/3212
    USPC .................... 451/5, 10, 11, 41, 57, 287, 288
    See application file for complete search history.

(56)                   References Cited

U.S. PATENT DOCUMENTS

| | | | |
|---|---|---|---|
| 6,924,641 B1 | 8/2005 | Hanawa et al. | |
| 6,986,698 B1 * | 1/2006 | Molnar ................. | B24B 37/013 |
| | | | 702/182 |
| 7,024,268 B1 * | 4/2006 | Bennett ........... | G05B 19/41875 |
| | | | 451/6 |
| 7,070,476 B2 | 7/2006 | Lehman et al. | |
| 7,112,960 B2 | 9/2006 | Miller et al. | |
| 7,128,803 B2 | 10/2006 | Owczarz et al. | |
| 7,156,717 B2 | 1/2007 | Molnar | |
| 7,354,332 B2 * | 4/2008 | Surana .................... | B24B 49/10 |
| | | | 451/6 |
| 8,284,560 B2 | 10/2012 | Iravani et al. | |
| 8,554,356 B2 | 10/2013 | Shimizu et al. | |
| 8,779,589 B2 * | 7/2014 | Simka ............... | H01L 23/53238 |
| | | | 438/650 |
| 9,242,337 B2 | 1/2016 | Qian et al. | |
| 9,375,824 B2 * | 6/2016 | Benvegnu ............... | B24B 49/04 |
| 11,850,699 B2 | 12/2023 | Xu et al. | |
| 11,865,664 B2 | 1/2024 | Xu et al. | |
| 2006/0105676 A1 | 5/2006 | O'Sullivan et al. | |
| 2007/0103150 A1 | 5/2007 | Tada et al. | |
| 2008/0099443 A1 | 5/2008 | Benvegnu et al. | |
| 2009/0104847 A1 | 4/2009 | Kobayashi et al. | |
| 2011/0189925 A1 * | 8/2011 | Iravani ................. | B24B 37/013 |
| | | | 451/5 |
| 2012/0276661 A1 | 11/2012 | Iravani et al. | |
| 2012/0276662 A1 | 11/2012 | Iravani et al. | |
| 2013/0273812 A1 | 10/2013 | Qian et al. | |
| 2014/0030826 A1 | 1/2014 | Ohta et al. | |
| 2014/0094098 A1 | 4/2014 | Shinozaki | |
| 2015/0262893 A1 | 9/2015 | Nakamura et al. | |
| 2015/0371907 A1 * | 12/2015 | Lu ........................... | H01L 22/26 |
| | | | 438/18 |
| 2016/0372388 A1 | 12/2016 | Benvegnu et al. | |
| 2017/0151647 A1 | 6/2017 | Duboust et al. | |
| 2018/0079048 A1 * | 3/2018 | Shen .................... | B24B 37/105 |
| 2018/0099374 A1 | 4/2018 | Shen et al. | |
| 2018/0203090 A1 * | 7/2018 | Xu ........................... | C09G 1/00 |
| 2019/0035699 A1 | 1/2019 | Lu et al. | |
| 2021/0379722 A1 | 12/2021 | Xu et al. | |
| 2021/0379724 A1 | 12/2021 | Xu et al. | |
| 2024/0116152 A1 | 4/2024 | Xu et al. | |

FOREIGN PATENT DOCUMENTS

| | | |
|---|---|---|
| JP | 2009-094382 | 4/2009 |
| JP | 2011-023579 | 2/2011 |
| JP | 2014-513435 | 5/2014 |
| JP | 2016-510953 | 4/2016 |
| JP | 2016-540383 | 12/2016 |
| KR | 10-2018-0079048 A | 7/2018 |
| TW | 201249598 | 12/2012 |
| TW | 2014/05650 | 2/2014 |
| TW | 201524682 | 7/2015 |
| WO | WO 2008/032753 | 3/2008 |
| WO | WO 2012/148716 | 11/2012 |
| WO | WO 2020/046502 | 3/2020 |

OTHER PUBLICATIONS

International Search Report and Written Opinion in International Appln. No. PCT/US2021/036189, dated Sep. 17, 2021, 12 pages.
Office Action in Japanese Appln. No. 2022-544299, dated Oct. 17, 2023, 9 pages (with English translation).
wikipedia.com [online], "Back end of line," available on or before Feb. 26, 2013, via Internet Archive: Wayback Machine URL <https://web.archive.org/web/20130226021818/https://en.wikipedia.org/wiki/Back_end_of_line>, retrieved on Apr. 30, 2025, retrieved from URL <https://en.wikipedia.org/wiki/Back_end_of_line>, 4 pages.
Notice of Allowance in Korean Appln. No. 10-2022-7026053, dated Aug. 29, 2024, 6 pages (with English translation).

\* cited by examiner

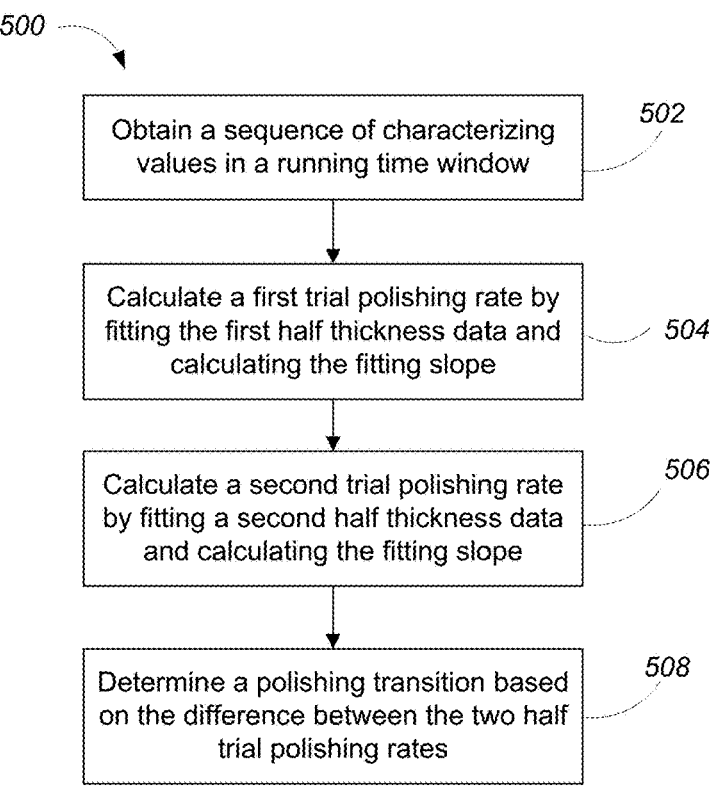

500

Obtain a sequence of characterizing values in a running time window — 502

Calculate a first trial polishing rate by fitting the first half thickness data and calculating the fitting slope — 504

Calculate a second trial polishing rate by fitting a second half thickness data and calculating the fitting slope — 506

Determine a polishing transition based on the difference between the two half trial polishing rates — 508

FIG. 5A

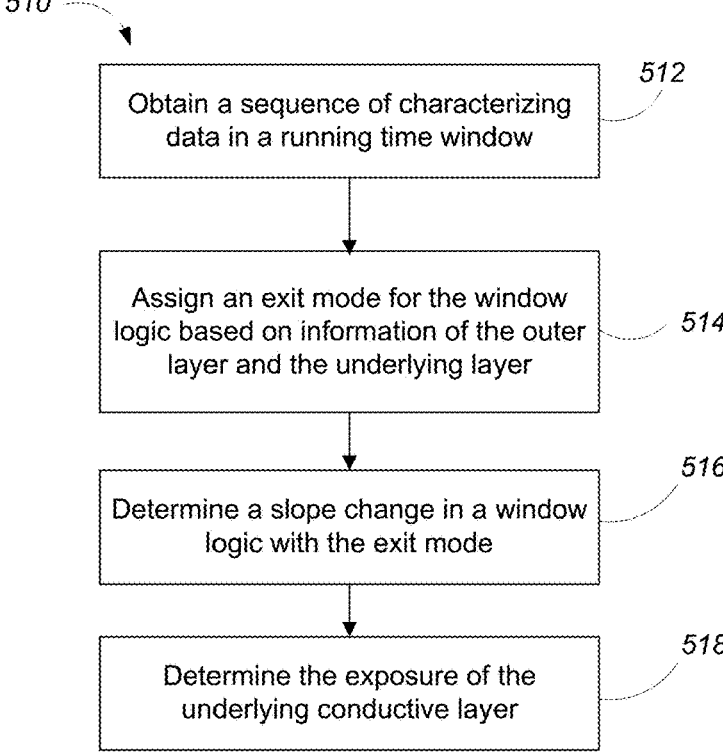

510

Obtain a sequence of characterizing data in a running time window — 512

Assign an exit mode for the window logic based on information of the outer layer and the underlying layer — 514

Determine a slope change in a window logic with the exit mode — 516

Determine the exposure of the underlying conductive layer — 518

FIG. 5B

PROFILE CONTROL DURING POLISHING OF A STACK OF ADJACENT CONDUCTIVE LAYERS

CROSS-REFERENCE TO RELATED APPLICATIONS

This application claims priority to U.S. Application Ser. No. 63/036,392, filed on Jun. 8, 2020, the disclosure of which is incorporated by reference.

TECHNICAL FIELD

The present disclosure relates to chemical mechanical polishing, and in particular to in-situ real time profile control during polishing a stack of adjacent conductive layers on a substrate.

BACKGROUND

An integrated circuit is typically formed on a substrate (e.g. a semiconductor wafer) by the sequential deposition of conductive, semiconductive or insulative layers on a silicon wafer, and by the subsequent processing of the layers.

One fabrication step involves depositing a filler layer over a non-planar surface, and planarizing the filler layer until the non-planar surface is exposed. For example, a conductive filler layer can be deposited on a patterned insulative layer to fill the trenches or holes in the insulative layer. The filler layer is then polished until the raised pattern of the insulative layer is exposed. After planarization, the portions of the conductive layer remaining between the raised pattern of the insulative layer form vias, plugs and lines that provide conductive paths between thin film circuits on the substrate. In addition, planarization may be used to planarize the substrate surface for lithography.

Chemical mechanical polishing (CMP) is one accepted method of planarization. This planarization method typically requires that the substrate be mounted on a carrier head. The exposed surface of the substrate is placed against a rotating polishing pad. The carrier head provides a controllable load on the substrate to push it against the polishing pad. A polishing liquid, such as slurry with abrasive particles, is supplied to the surface of the polishing pad.

During semiconductor processing, it may be important to determine one or more characteristics of the substrate or layers on the substrate. For example, it may be important to know the thickness of a conductive layer during a CMP process, so that the process may be terminated at the correct time. A number of methods may be used to determine substrate characteristics. For example, optical sensors may be used for in-situ monitoring of a substrate during chemical mechanical polishing. Alternately (or in addition), an eddy current sensing system may be used to induce eddy currents in a conductive region on the substrate to determine parameters such as the local thickness of the conductive region.

SUMMARY

According to an aspect, a method of controlling polishing includes polishing a stack of adjacent conductive layers on a substrate, measuring with an in-situ eddy current monitoring system a first sequence of characterizing values for a first region of the substrate during polishing, calculating a first polishing rate from the first sequence of characterizing values, calculating a first adjustment for a first polishing parameter based on the first polishing rate, detecting a first change in the polishing rate that meets at least one first predetermined criterion that indicates exposure of the underlying conductive layer, measuring with the in-situ eddy current system a second sequence of characterizing values for the first region of the substrate during polishing upon detecting the change in the polishing rate, calculating a second polishing rate from the second sequence of characterizing values, and calculating a second adjustment for the first polishing parameter based on the second polishing rate. The stack of adjacent conductive layers includes an outer conductive layer and an underlying conductive layer. The first characterizing values depend on thicknesses and conductivities of the conductive layers in the stack including a thickness of the outer conductive layer undergoing polishing in the first region. The second sequence of characterizing values depend on thicknesses and conductivities of remaining conductive layers in the stack including a thickness of the underlying conductive layer undergoing polishing.

In another aspect, a method of controlling polishing includes polishing a stack of adjacent conductive layers on a substrate, measuring with an in-situ eddy current monitoring system a sequence of characterizing values for the substrate during polishing, calculating a polishing rate from the sequence of characterizing values repeatedly during polishing, calculating one or more adjustments for one or more polishing parameters based on a current polishing rate using a first control algorithm for an initial time period, detecting a change in the polishing rate that meets at least one first predetermined criterion that indicates exposure of the underlying conductive layer and calculating one or more adjustments for one or more polishing parameters based on the polishing rate using a different second control algorithm for a subsequent time period after detecting the change in the polishing rate.

In another aspect, a method of controlling polishing includes polishing a stack of adjacent layers on a substrate, measuring with an in-situ monitoring system a sequence of characterizing values for the substrate during polishing, and executing a plurality of instances of a profile control algorithm on a controller. The plurality of instances include a first instance and a second instance having different values for a control parameter. The first instance of the profile control algorithm receives the sequence of characterizing values during an initial time period, and the second instance of the profile control algorithm receives the sequence of characterizing values during the initial time period and a subsequent time period. For an initial time period one or more polishing parameters are controlled using the first instance of the profile control algorithm based on the sequence of characterizing values received during the initial time period, exposure of the underlying layer is detected based on the sequence of characterizing values from the in-situ monitoring system, and for the subsequent time period after detecting the exposure of the underlying layer the one or more polishing parameters are controlled using the second instance of the profile control algorithm based on the sequence of characterizing values received during the initial time period and an subsequent time period.

In another aspect, computer program products are operable to perform the computational steps of any of these methods. In another aspect, a polishing system includes a platen to support a polishing pad, a carrier head to hold a substrate against the poilishing pad, an in-situ monitoring system, and a controller configured to perform the computational steps of any of these methods.

Implementations of any of the above aspects may include one or more of the following features.

Calculating the first adjustment for the first polishing parameter may include calculating a first projected time at which the first region reaches a target value based on the first polishing rate, measuring a third sequence of characterizing values for a second region of the substrate during polishing with the in-situ eddy current system, calculating a third polishing rate from the third sequence of characterizing values, and calculating a first desired polishing rate for the second region based on the first polishing rate and the third polishing rate to bring the first region and the second region to the target value at substantially the same time. Calculating the second adjustment for the first polishing parameter may include calculating a second projected time at which the first region reaches the target value based on the second polishing rate, measuring a fourth sequence of characterizing values for the second region of the substrate during polishing with the in-situ eddy current system, calculating a fourth polishing rate from the fourth sequence of characterizing values, and calculating the second adjustment for the first polishing parameter includes calculating a second desired polishing rate for the second region based on the second polishing rate and the fourth polishing rate to bring the first region and the second region to the target value at substantially the same time.

The steps of calculating the first polishing rate and calculating the first adjustment for a first polishing parameter may be iterated prior to detecting the change in the polishing rate at a first frequency, and the steps of calculating the second polishing rate and calculating the second adjustment for the first polishing parameter may be iterated after to detecting the change in the polishing rate at a second frequency. The first frequency may be different from the second frequency.

A first Preston matrix may be used for calculating the first adjustment for the first polishing parameter, and a second Preston matrix may be used for calculating the second adjustment for the second polishing parameter. The first Preston matrix and second Preston matrix may include different values for at least one element at the same row and column in the first Preston matrix and second Preston matrix.

After detecting the first change in the polishing rate, a second change in the polishing rate that meets at least one second predetermined criterion that indicates exposure of a further layer below the underlying conductive layer may be detected. The at least one first predetermined criterion and the at least one second predetermined criterion may be different criteria. One of the first and second predetermined criteria may be a window logic having a bottom exit mode, and another of the first and second predetermined criteria may be a window logic having a right side exit mode.

The steps of calculating the first polishing rate may be performed using a first function, and calculating the second polishing rate may be performed using a different second function. The first function and the second function may use running windows of different duration. Calculating the first adjustment for the first polishing parameter may include limiting the first adjustment to a first maximum change, and calculating the second adjustment for the second polishing parameter may include limiting the second adjustment to a different second maximum change. Calculating the first polishing rate from the first sequence of characterizing values may use a correlation curve based on a resistivity of a layer from the stack of adjacent conductive layers. Calculating the second polishing rate from the second sequence of characterizing values may use the same correlation curve based on the resistivity of the same layer from the stack of adjacent conductive layers. The layer may be the last conductive layer from the stack of adjacent conductive layers.

Repeatedly calculating the polishing rate includes may use a correlation curve based on a resistivity of a same layer from the stack of adjacent conductive layers during the initial time period and the subsequent time period.

The carrier head may include a plurality of independently controllable chambers. The first polishing parameter may be a pressure for one of the chambers, and the one or more polishing parameters may include one or more pressures for one or more of the chambers.

Certain implementations can include one or more of the following advantages. An in-situ real time profile control system can be used when polishing a stack of adjacent conductive layers on a substrate. The system can detect exposure of an underlying conductive layer in the stack, and use this as a trigger to modify operation of the profile control system to account for the different layers. Within-wafer polishing uniformity can be improved.

The details of one or more implementations are set forth in the accompanying drawings and the description below. Other aspects, features and advantages will be apparent from the description and drawings, and from the claims.

BRIEF DESCRIPTION OF DRAWINGS

FIG. 5A is a flow diagram showing an implementation of detecting the exposure of the underlying conductive layer.

FIG. 5B is a flow diagram showing another implementation of detecting the exposure of the underlying conductive layer.

Like reference symbols in the various drawings indicate like elements.

DETAILED DESCRIPTION

A polishing apparatus can use an in-situ monitoring system, e.g., an eddy current monitoring system, to detect the thickness of an outer layer that is being polished on a substrate. During polishing of the outer layer, the in-situ monitoring system can determine the thickness of different locations of the layer on the substrate. The thickness measurements can be used to trigger a polishing endpoint and/or to adjust processing parameters of the polishing process in real time. For example, a substrate carrier head can adjust the pressure on the backside of the substrate to increase or decrease the polishing rate of the locations of the outer layer. The polishing rate can be adjusted so that the locations of the layer are substantially the same thickness after polishing.

The CMP system can adjust the polishing rate so that polishing of the locations of the layer completes at about the same time. Such profile control can be referred to as real time profile control (RTPC).

For manufacturing of some devices, a substrate to be polished can include a stack of multiple conductive layers of different compositions. Each of the layer may have a different conductivity, and/or a different polishing rate in response to a given applied pressure. When polishing through multiple conductive layers on a substrate consecutively in a single polishing process, within-wafer non-uniformity (WIWNU) remains a challenge. However, an in-situ real time profile control system can address this problem. In particular, a monitoring system can detect a polishing transition when polishing process removes an outer conductive layer and exposes an underlying conductive layer, e.g., by detecting a change in rate of change of the measured characteristic. This can trigger a modification of the in-situ real time profile control system, leading to improved polishing uniformity.

Figure 1A:
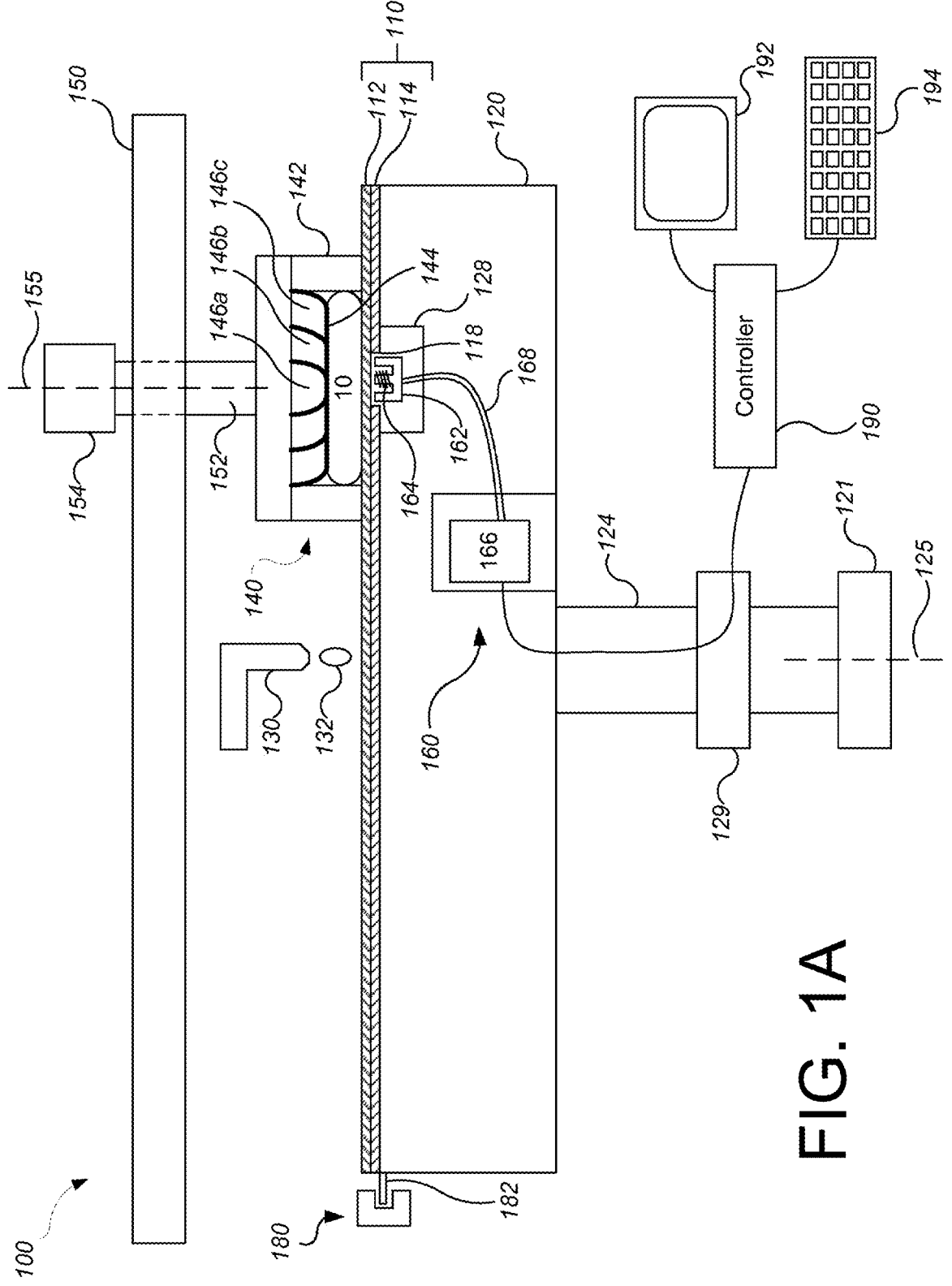
FIG. 1A is a schematic side view, partially cross-sectional, of a chemical mechanical polishing station that includes an eddy current monitoring system.
Figure 1B:
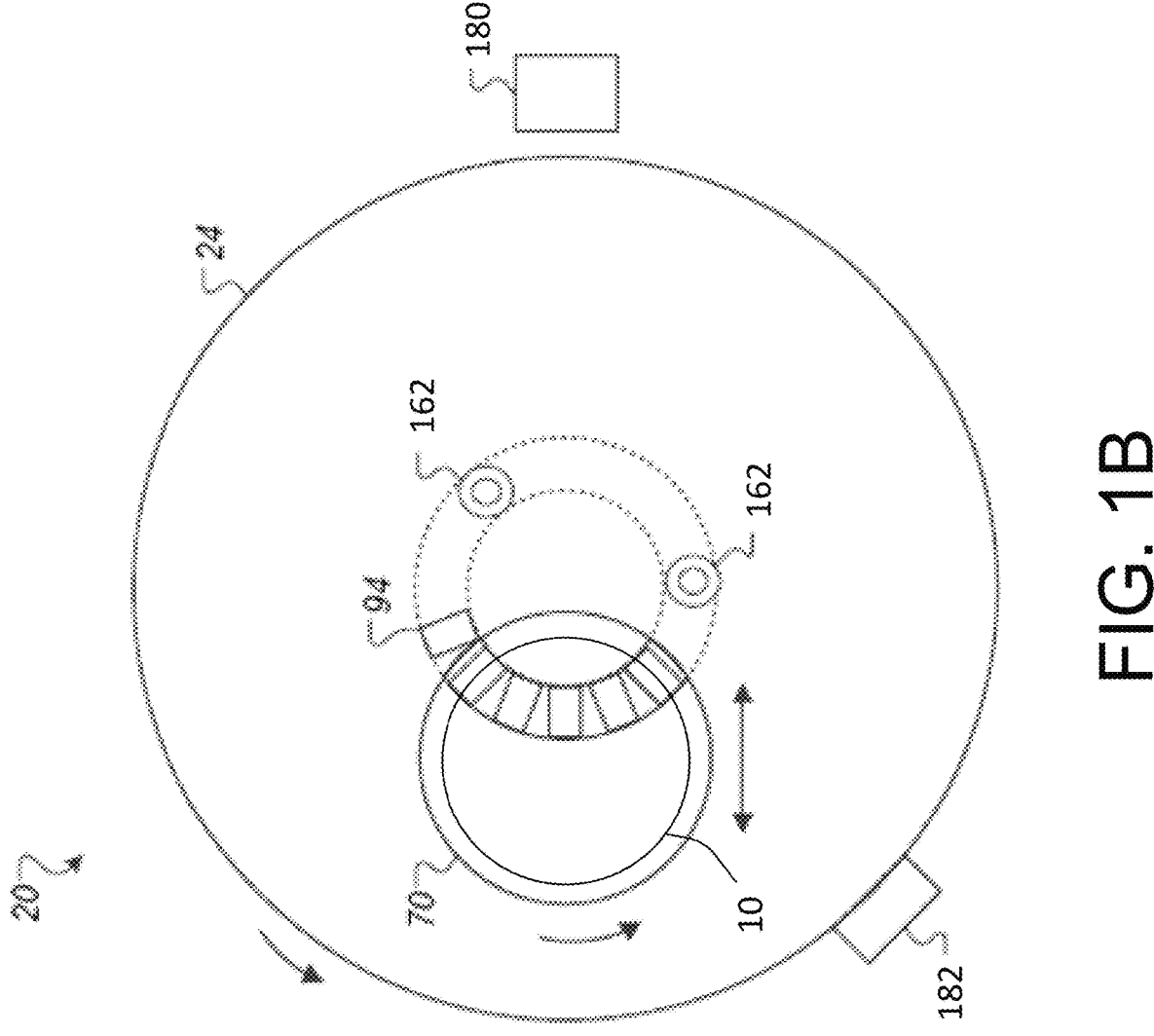
FIG. 1B is a schematic top view of a chemical mechanical polishing station.

FIGS. 1A and 1B illustrate an example of a polishing apparatus 100. The polishing apparatus 100 includes a rotatable disk-shaped platen 120 on which a polishing pad 110 is situated. The platen is operable to rotate about an axis 125. For example, a motor 121 can turn a drive shaft 124 to rotate the platen 120. The polishing pad 110 can be a two-layer polishing pad with an outer polishing layer 112 and a softer backing layer 114.

The polishing apparatus 100 can include a port 130 to dispense polishing liquid 132, such as slurry, onto the polishing pad 110. The polishing apparatus can also include a polishing pad conditioner to abrade the polishing pad 110 to maintain the polishing pad 110 in a consistent abrasive state.

The polishing apparatus 100 includes at least one carrier head 140. The carrier head 140 is operable to hold a substrate 10 against the polishing pad 110. The carrier head 140 can have independent control of the polishing parameters, for example pressure, associated with each respective substrate.

In particular, the carrier head 140 can include a retaining ring 142 to retain the substrate 10 below a flexible membrane 144. The carrier head 140 also includes a plurality of independently controllable pressurizable chambers defined by the membrane, e.g., three chambers 146a-146c, which can apply independently controllable pressures to associated zones on the flexible membrane 144 and thus on the substrate 10. Although only three chambers are illustrated in FIG. 1 for ease of illustration, there could be one or two chambers, or four or more chambers, e.g., five chambers.

The carrier head 140 is suspended from a support structure 150, e.g., a carousel or a track, and is connected by a drive shaft 152 to a carrier head rotation motor 154 so that the carrier head can rotate about an axis 155. Optionally the carrier head 140 can oscillate laterally, e.g., on sliders on the carousel 150 or track; or by rotational oscillation of the carousel itself. In operation, the platen is rotated about its central axis 125, and the carrier head is rotated about its central axis 155 and translated laterally across the top surface of the polishing pad.

While only one carrier head 140 is shown, more carrier heads can be provided to hold additional substrates so that the surface area of polishing pad 110 may be used efficiently.

The polishing apparatus 100 also includes an in-situ monitoring system 160. The in-situ monitoring system 160 generates a time-varying sequence of values that depend on the thickness of a layer on the substrate. The in-situ monitoring system 160 includes a sensor head at which the measurements are generated; due to relative motion between the substrate and the sensor head, measurements will be taken at different locations on the substrate.

The in-situ-monitoring system 160 can be an eddy current monitoring system. The eddy current monitoring system 160 includes a drive system to induce eddy currents in a conductive layer on the substrate and a sensing system to detect eddy currents induced in the conductive layer by the drive system. The monitoring system 160 includes a core 162 positioned in a recess 128 to rotate with the platen, at least one coil 164 wound around a portion of the core 162, and drive and sense circuitry 166 connected by wiring 168 to the coil 164. The combination of the core 162 and coil 164 can provide the sensor head. In some implementations, the core 162 projects above the top surface of the platen 120, e.g., into a recess 118 in the bottom of the polishing pad 110.

The drive and sense circuitry 166 is configured to apply an oscillating electric signal to the coil 164 and to measure the resulting eddy current. A variety of configurations are possible for the drive and sense circuitry and for the configuration and position of the coil(s), e.g., as described in U.S. Pat. Nos. 6,924,641, 7,112,960 and 8,284,560, and in U.S. Patent Publication Nos. 2011-0189925 and 2012-0276661. The drive and sense circuitry 166 can be located in the same recess 128 or a different portion of the platen 120, or could be located outside the platen 120 and be coupled to the components in the platen through a rotary electrical union 129.

In operation the drive and sense circuitry 166 drives the coil 164 to generate an oscillating magnetic field. At least a portion of magnetic field extends through the polishing pad 110 and into substrate 10. If a conductive layer is present on substrate 10, the oscillating magnetic field generates eddy currents in the conductive layer. The eddy currents cause the conductive layer to act as an impedance source that is coupled to the drive and sense circuitry 166. As the thickness of the conductive layer changes, the impedance changes, and this can be detected by the drive and sense circuitry 166.

Alternatively or in addition, an optical monitoring system, which can function as a reflectometer or interferometer, can be secured to the platen 120 in the recess 128. If both systems are used, the optical monitoring system and eddy current monitoring system can monitor the same portion of the substrate.

The CMP apparatus 100 can also include a position sensor 180, such as an optical interrupter, to sense when the core 162 is beneath the substrate 10. For example, the optical interrupter could be mounted at a fixed point opposite the carrier head 140. A flag 182 is attached to the periphery of the platen. The point of attachment and length of flag 182 is selected so that it interrupts the optical signal of sensor 180 while the core 162 sweeps beneath substrate 10. Alternatively or in addition, the CMP apparatus can include an encoder to determine the angular position of platen.

A controller 190, such as a general purpose programmable digital computer, receives the intensity signals from the eddy current monitoring system 160. The controller 190 can include a processor, memory, and I/O devices, as well as an output device 192 e.g., a monitor, and an input device 194, e.g., a keyboard. Although illustrated as a single device, the controller 190 can include multiple processors across multiple devices, e.g., a networked or otherwise distributed computing system.

The signals can pass from the eddy current monitoring system 160 to the controller 190 through the rotary electrical union 129. Alternatively, the circuitry 166 could communicate with the controller 190 by a wireless signal.

Since the core 162 sweeps beneath the substrate with each rotation of the platen, information on the conductive layer thickness is accumulated in-situ and on a continuous real-time basis (once per platen rotation). The controller 190 can be programmed to sample measurements from the monitoring system when the substrate generally overlies the core 162 (as determined by the position sensor). As polishing progresses, the thickness of the conductive layer changes, and the sampled signals vary with time. The time varying sampled signals typically include a sequence of raw signal values. The measurements from the monitoring systems can be displayed on the output device 192 during polishing to permit the operator of the device to visually monitor the progress of the polishing operation.

Figure 2:
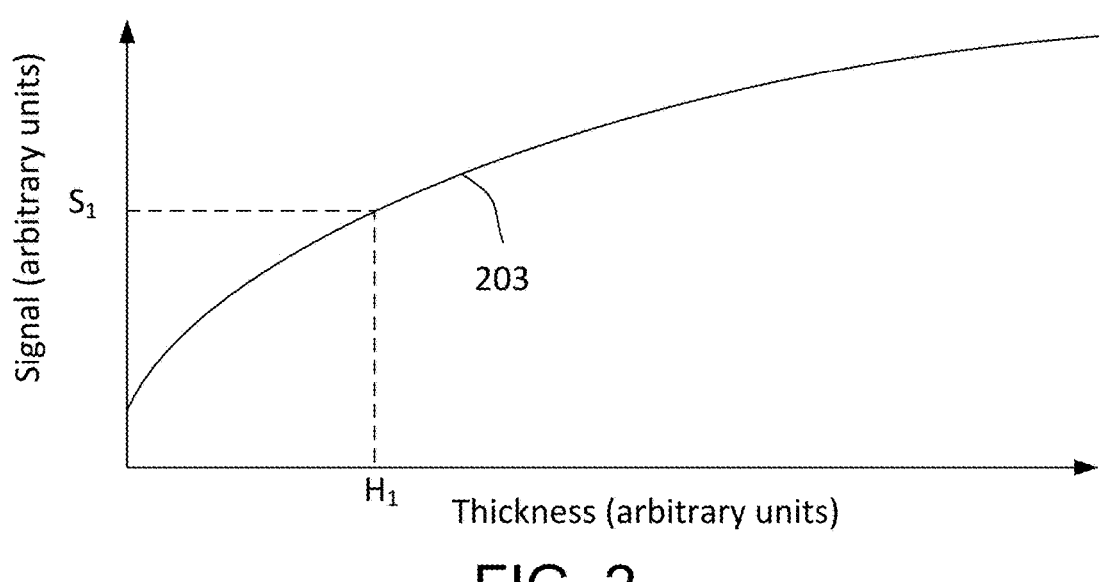
FIG. 2 is a schematic graph of a static formula for determining substrate thickness based on measured signals.

The signals, e.g., the sequence of raw signal values, from the eddy current monitoring system 160 can be converted into a time-based sequence of characterizing values, e.g., thickness values. For example, the controller 190 can use a correlation curve that relates the signal measured by the in-situ monitoring system 160 to the thickness of the layer being polished on the substrate 10 to generate an estimated measure of the thickness of the layer being polished. An example of a correlation curve 203 is shown in FIG. 2. In the coordinate system depicted in FIG. 2, the vertical axis represents the value of the signal received from the in-situ monitoring system 160, whereas the horizontal axis represents the value for the thickness of the layer of the substrate 10. For a given signal value, the controller 190 can use the correlation curve 203 to generate a corresponding thickness value. The correlation curve 203 can be considered a "static" formula, in that it predicts a thickness value for each signal value regardless of the time or position at which the sensor head obtained the signal. The correlation curve 203 can be represented by a variety of functions, such as a polynomial function, or a look-up table (LUT) combined with linear interpolation. However, in some implementations, the signals could be converted into other measurements, e.g., conductivity measurements, or the signals could themselves be used as the characterizing values.

Returning to FIG. 1, in operation, the CMP apparatus 100 can use the eddy current monitoring system 160 and the controller 190 to measure the polishing progress. In particular, the eddy current monitoring system 160 and the controller 190 can monitor the thickness of an outer conductive layer or an underlying conductive layer, estimate a first endpoint time when the projected thickness of the outer conductive layer in a target region on the substrate meets a target thickness, detect a polishing transition when an underlying conductive layer has been exposed, estimate a second endpoint time when the projected thickness of the underlying conductive layer in the target region on the substrate meets the target thickness, adjust a polishing pressure/rate on a control zone at a time of a plurality of adjustment times to bring the thickness of both target zone and control zone to the target thickness at substantially the same time, and/or determine when the underlying stop layer has been exposed. Possible process control, polishing transition detection and endpoint criteria for the detector logic include local minima or maxima, changes in slope, threshold values in amplitude or slope, or combinations thereof.

The controller 190 may also be connected to the pressure mechanisms that control the pressure applied by carrier head 140, to carrier head rotation motor 154 to control the carrier head rotation rate, to the platen rotation motor 121 to control the platen rotation rate, or to slurry distribution system 130 to control the slurry composition supplied to the polishing pad. In addition, the computer 190 can be programmed to divide the measurements from the eddy current monitoring system 160 from each sweep beneath the substrate into a plurality of sampling zones, to calculate the radial position of each sampling zone, and to sort the amplitude measurements into radial ranges, as discussed in U.S. Pat. No. 6,399,501. After sorting the measurements into radial ranges, information on the film thickness can be fed in real-time into a closed-loop controller to periodically or continuously modify the polishing pressure profile applied by a carrier head in order to provide improved polishing uniformity.

Figure 3:
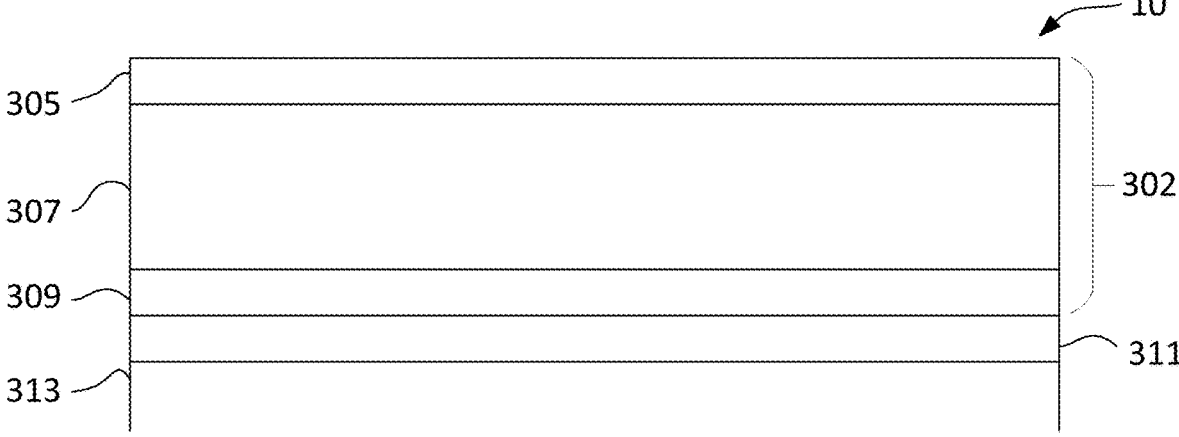
FIG. 3 is a schematic cross-sectional view of a stack of conductive layers on a substrate.

FIG. 3 illustrates an example of a substrate 10 that includes a stack 302 of adjacent conductive layers on a wafer 313. A layer structure 311 that can include other dielectric, conductive and/or semiconductive layers can be positioned between the wafer 313 and the stack 302 of conductive layers. Although illustrated as layers of uniform thickness deposited on a flat surface, the layers could be deposited on a patterned surface, and the layers themselves could be patterned.

The stack 302 can include at least two layers—an outer conductive layer and an adjacent underlying conductive layer. However, the stack could include three, four or more layers. For example in FIG. 3, the outermost conductive layer 305 is on top of an underlying conductive layer 307, and the underlying conductive layer 307 is on top of another underlying conductive layer 309. Adjacent layers will have different compositions and different conductivities. For example, the outer layer can be copper, and the underlying layer can be a tantalum liner layer. As another example, the outer layer can be ruthenium, and the underlying layer can be a titanium nitride liner layer. As another example, the outer layer can be tungsten, and the underlying layer can be titanium nitride liner layer. Adjacent layers can have different initial pre-polishing thicknesses. For example, the outermost layer 305 can be thinner, thicker or equally thick comparing to its underlying layer 307. For another more specific example, the outer layer 309 can be 200-1000 Å thick, whereas the underlying layer 311 can be 10-100 Å thick.

The last conductive layer to be polished in the stack, e.g., the bottom underlying layer 309, can serve as a reference layer for monitoring in a polishing process, as discussed further below.

Figures 4A, 4B, 4C:
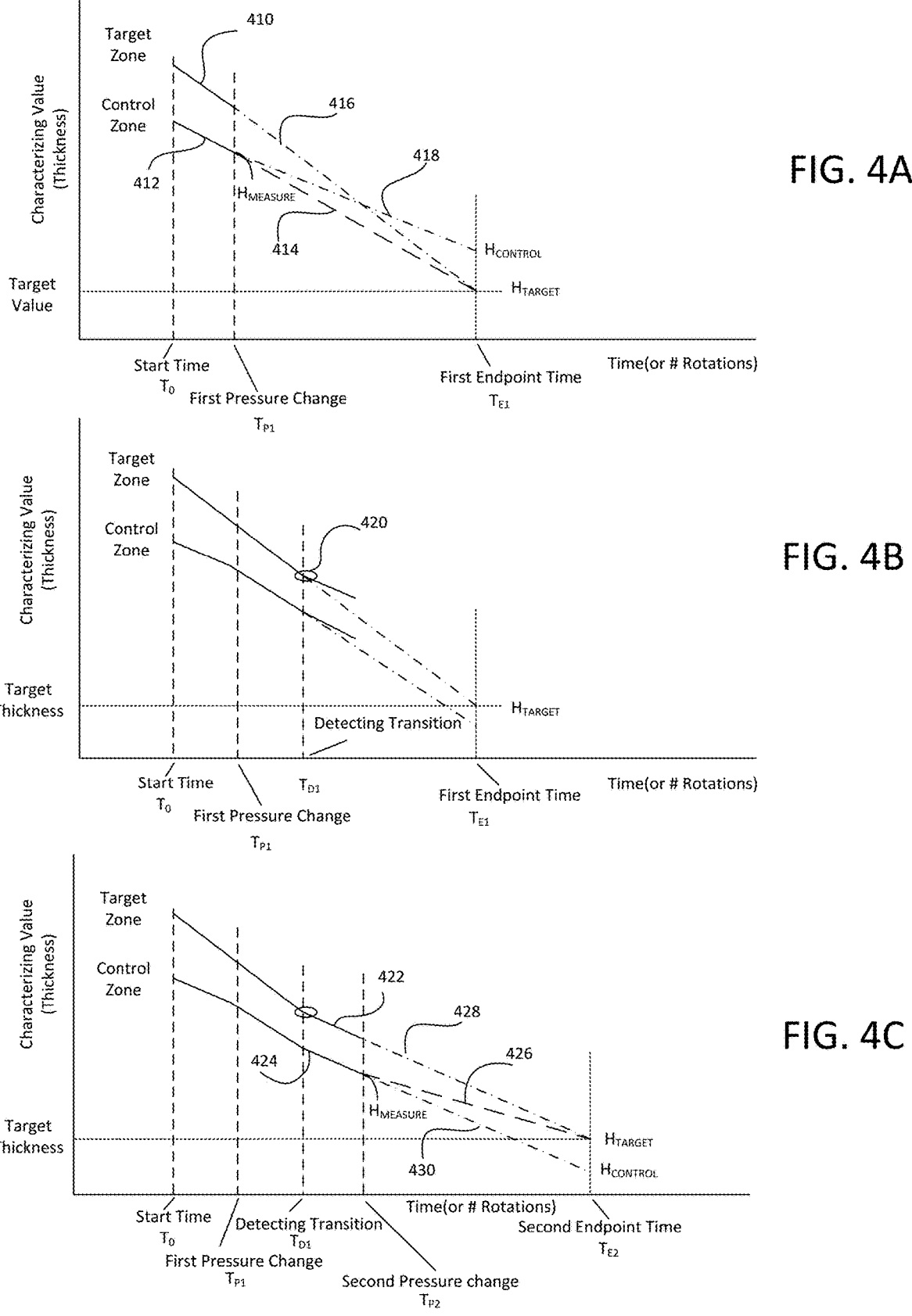
FIG. 4A is a schematic graph illustrating a first adjustment for a first polishing parameter based on the first polishing rate.
FIG. 4B is a schematic graph of detecting a change in the polishing rate that indicates exposure of the underlying conductive layer
FIG. 4C is a schematic graph illustrating a second adjustment for the first polishing parameter based on the second polishing rate.

FIGS. 4A, 4B and 4C illustrate a process of in-situ real time profile control for use in polishing a stack of adjacent conductive layers on a substrate. Referring to FIG. 4A, the process can commence, e.g., at time $T_0$, with polishing of the outer conductive layer.

The polishing process is monitored by the eddy current monitoring system 160, and as noted above, the signals from the eddy current monitoring system 160 can be sorted into multiple zones based on the position of the measurement. The multiple zones can include a target zone and a control zone. The target zone can also be referred to as a first region and the control zone can also be referred as a second region. For the in-situ real time profile controlling method, there may be more than one control zone, for example, two to ten control zones. Each zone can correspond to one of the pressurizable chambers in the carrier head that controls the down force on a portion of the substrate. Thus, the total number of zone can be equal to the number of controllable chambers in the carrier head, e.g., two to eleven.

For each zone of the multiple zones, the sequence of signal values for that zone are converted into a sequence of characterizing values for the stack of adjacent conducting layers. The characterizing values can represent a total thickness of the stack of adjacent conducting layers, but without compensation for the fact that the different conductive layers have different conductivities. In particular, the characterizing values can be calculated from the signal values using a static correlation curve as shown in FIG. 2. The static correlation curve is based on the conductivity of a reference layer. The reference layer can be chosen as the last layer in the stack to be polished, e.g., the bottom layer in the stack of adjacent conductive layers on the substrate. Alternatively, the reference layer can be chosen as the another layer in the stack to be polished, e.g., the first layer, the second layer, etc. However, as discussed below the correlation curve for the same resistivity is used in calculation of the thickness of the stack of adjacent conductive layers on the substrate, regardless of the layer currently being polished.

An in-situ real time profile control algorithm can use the sequence of thickness measurements for each zone to adjust one or more polishing parameters, e.g., the pressure in one or more chambers in the carrier head, to provide improved polishing uniformity. For example, the in-situ real time profile control algorithm can be configured to cause each control zone be closer to the desired thickness at the endpoint time (than without such adjustments).

In particular, for each zone, a function is fit to the sequence of characterizing values for that zone. The example here shows first-order linear functions, e.g., lines 410 and 412, that are fit to each sequence of characterizing values during polishing of the outer conductive layer. However, the fitting function doesn't have to be linear, for example, it can be a higher-order polynomial or exponential function.

As shown in FIG. 4A, along the time axis (horizontal axis), three time points has been marked, they are the start time $T_0$, a pressure change time $T_{P1}$, and the first endpoint time $T_{E1}$. The start time $T_0$ may or may not be the exact starting time of a polishing process for the outer conductive layer on the stack of adjacent layers on a substrate. It can be a time when data starts to be collected from the in-situ monitoring system, or can represent the first data used for fitting of the function. The pressure change time $T_{P1}$ represents a time at which the controller adjusts pressure when polishing the outer conductive layer to attempt to improve polishing uniformity. Although FIG. 4A illustrates a single pressure change time $T_{P1}$, there can be a plurality of pressure adjustments. For example, pressure adjustments can occur at a fixed frequency, e.g., every 2-30 platen rotations or every 3-30 seconds.

The slope of the fitting functions, e.g., the lines 410 and 412, provide current polishing rates for the respective zones at the pressure change time $T_{P1}$. In this context, the "polishing rate" should be understood as indicating the rate of change of the characterizing value, e.g., it can, but need not, be expressed as a rate of change of the thickness measurement. The current polishing rate $k_1$ for the target zone when polishing the outer conductive layer, can be used to project the target zone thickness along the time axis, as shown by a first dashed line 416. The first endpoint time $T_{E1}$ is calculated as the time that the projected thickness of the target region reaches the target characterizing value, e.g., target thickness, $H_{TARGET}$. Similarly, the current polishing rate $k_3$ for the control zone can be used to project a control zone thickness along the time axis, as shown by a second dashed line 418.

The controller 190 in FIG. 1A can determine the projected thickness $H_{CONTROL}$ of the control zone at the first endpoint time $T_{E1}$ based on the third polishing rate $k_3$. Assuming that the projected thickness of the control zone does not equal the target thickness $H_{TARGET}$ at the first endpoint time $T_{E1}$, the controller can calculate a first desired polishing rate $k_{D1}$, e.g., shown by the slope of the dashed line 414, to bring the target zone and control zone to the target thickness at substantially the same time. The measured thickness of the control zone $H_{MEASURE}$ at the pressure change time $T_{P1}$, as shown in the FIG. 3A, can be used to calculate of the desired polishing rate $k_{D1}$, for example according to the following equation:

$$k_{D1} = \frac{H_{MEASURE} - H_{TARGET}}{T_{P1} - T_{E1}}$$

The controller can adjust a polishing parameter, e.g., the pressure in the chambers associated with the control zone, to change the current third polishing rate $k_3$ to the first desired polishing rate $k_{D1}$. Adjustments of chamber pressure in each chamber 146a, 146b and 146c to bring the polishing rate of the control zone to the desired polishing rate can be calculated using a Preston matrix associated with each conductive layer.

FIG. 4B illustrates an example of detecting exposure of the underlying conductive layer during polishing. The detection of transition time is marked in the time axis as $T_{D1}$. The transition point in the plot of thickness of the first region is marked by 420 at the time $T_{D1}$. In brief, because of the difference in conductivity between the outer layer and the underlying layer, even if the physical polishing rate remains constant there will be a change in the apparent polishing rate. In particular, the controller can be configured to detect a change in the apparent polishing rate.

In some implementations, as shown by the flow diagram 500 in FIG. 5A, detection of exposure of and commencement of polishing of an underlying conductive layer can be performed by obtaining a running time window of a sequence of characterizing values at the target region through the in-situ monitoring system 160 (step 502), calculating a first trial polishing rate $k_{t1}$ based on a first portion of the sequence of characterizing values within the time window (step 504), calculating a second trial polishing rate $k_{t2}$ based on the rest of the sequence of charactering values within the time window (step 506), and determining a slope change by comparing the second trial polishing rate $k_{t2}$ with the first trial polishing rate $k_{t1}$ (step 508). The method shown in the flow diagram 500 may be implemented for a plurality of times before the end of polishing.

Some other implementations, as shown by a flow diagram 510 in the FIG. 5B, include a window logic to detect a deflection point of the polishing rate of the target zone. In this technique, a window logic is used to analyze a sequence of characterizing values within the time window. The analysis can be performed by obtaining a sequence of characterizing data in a running time window (step 512), assigning an exit mode for the window logic based on information of the outer layer and the underlying layer (step 514), determining a slope change in a window logic with the exit mode (step 516), and determining the exposure of the underlying conductive layer (or a polishing transition)(step 518). The information of the outer layer and the underlying layer can be the relation between a nominal rate of the outer layer $r_1$ and a nominal rate of the underlying layer $r_2$. The exit mode of a window logic can be chosen by considering the relation of $r_1$ and $r_2$ in a manner as, for example, if $r_2 > r_1$, there will be a polishing slope increase at a polishing transition, thus a bottom exit mode can be chosen in the window logic, for another example, if $r_2 < r_1$, there will be a polishing slope decrease at a polishing transition, thus a right exit mode can be chosen in the window logic. The nominal rate $r_1$ and $r_2$ can be calculated with in-situ monitoring system under open-loop polishing each layer on a substrate independently.

The nominal rate of $r_1$ and $r_2$ and the target polishing rate $k_1$ and $k_2$ of each layer are related through a preset down force $F_D$ on the carrier head 140, as below, $$r_1 = \frac{k_1}{F_D}, \text{ and } r_2 = \frac{k_2}{F_D}.$$

The window logic may have predetermined parameters such as a time window and a height window. Adjustments of the predetermined parameters of the window logic may be needed to reflect a deflection point in a polishing profile of a region. The number of windows in the window logic is at least one or above.

Either transition detection method can work for a stack of adjacent conducting layers on a substrate where the physical polishing rate of an outer layer and an underlying layer turn to be equal, so long as there is a change in the apparent polishing rate due to the compositions of the outer layer and the underlying layer being different.

Upon the detection of a transition in the polishing profile of a target zone, in some implementations, a second control algorithm can commence control of the polishing process. In some implementations, the second control algorithm performs the same set of operations as the first control algorithm, but uses different values for the control variables. Examples of control variables having values that can be changed between the first and second control algorithm include the nominal polishing rate of the layer being polished, the Preston matrix used to convert polishing control parameters into polishing rates (and vice versa), the window logic for the current polishing step, e.g., the exit mode for the window logic, the pressure change frequency, the pressure update limits, the noise matrices, the rate estimate algorithms, the zone offsets, and the gain.

For example, the Preston matrix can change from a first decoupled diagonal matrix having a first set of values along the diagonal to a second decoupled diagonal matrix having a different second set of values along the diagonal. This would be appropriate if the underlying layer does not have the same response to pressure as the outer layer. For example, if the underlying layer is a harder substance, it may be less responsive to changes in pressure, so larger values may be needed in the Preston matrix to account for the pressure change needed to provide a desired pressure. As another example, the Preston matrix can change from a decoupled diagonal matrix to an off-diagonal coupled matrix.

As another example, the adjustment frequency for chamber pressure can increase or decrease. This would be appropriate if the underlying layer will take more or less time to polishing than the outer layer. For example, if the underlying layer is expected to take less time to polishing than the outer layer, the adjustment frequency of chamber pressure can be increased to ensure that there are a sufficient number of pressure modifications for the control zone to reliably match the target zone thickness.

As another example, the exit mode for a window logic can change from a right side exit mode to a bottom exit mode, or vice versa. For example, if the apparent polishing rate upon exposure of the additional underlying layer will be higher, then the exit mode of the window logic can be changed to a bottom exit mode. If the apparent polishing rate upon exposure of the additional underlying layer will be lower, then the exit mode of the window logic can be changed to a right side exit mode.

The pressure update limits refer to the maximum amount that the pressure in the carrier head is permitted to change at each pressure change. Having the controller limit the pressure changes can prevent over-correction and artificially induced oscillations in the polishing rates. Changing the pressure update limit would be appropriate if the underlying layer will take more or less time to polishing than the outer layer. For example, if the underlying layer is expected to take less time to polishing than the outer layer, the pressure update limit can be increased to ensure that, given the lower number of modifications that will occur, the pressure will change sufficiently for the control zone to reliably match the target zone thickness.

The rate estimate algorithm refers to the specific function that is used to calculate the polishing rate. In particular, in calculating the polishing rate, the controller typically uses a running window, e.g., a certain number of the most recent characterizing values. Changing the size of the running window, e.g., the number of the most recent characterizing values used to calculate the polishing rate, would be appropriate if the signal generated during polishing the underlying layer has more or less noise than the signal generated during polishing of the outer layer. For example, if signal generated during polishing of the underlying layer is noisier, the size of the running window can be increased to provide a longer averaging time.

In some implementations, the second control algorithm starts to collect characterizing values, calculate a polishing rate of a target zone, and project an endpoint time as early as when the polishing process starts in the outer conductive layer, e.g., at $T_0$. However, the second control algorithm works independently of the first control algorithm, and the controller does not actually pass control of the current polishing process from the first control algorithm to the second control algorithm until a polishing transition (e.g., at $T_{D1}$) is detected plus a sleeping time $T_s$. The sleeping time $T_s$ can be a fraction of a second or more. The method of running two control algorithms simultaneously and independently can ensure a seamless control transition upon a polishing transition being detected, as a control algorithm needs some time to calculate the target polishing rate for the current layer under polishing.

FIG. 4C illustrates the multiple pressure control method when polishing on the underlying conductive layer on a substrate. Similarly, the example here shows first-order linear functions, e.g. lines 422 and 424, that are fit to each sequence of characterizing values during polishing of the underlying conductive layer. The fitting functions doesn't have to be linear, as illustrated earlier in FIG. 4A.

As shown in FIG. 4C, another pressure change time $T_{P2}$ and the second endpoint time $T_{E2}$ are marked along the time axis. The pressure change time $T_{P2}$ represents a time at which the controller adjusts pressure when polishing the underlying conductive layer to attempt to improve polishing uniformity. Although FIG. 4C illustrates a single pressure change time $T_{P2}$, there can be a plurality of pressure adjustments. For example, pressure adjustments can occur at a fixed frequency, e.g., every 2-30 platen rotations or every 3-30 seconds.

The slope of the fitting functions, e.g., lines 422 and 424, provide current polishing rates for respective zones at the pressure change time $T_{P2}$. The current polishing rate $k_2$ for the target zone when polishing the underlying layer, can be used to project the target zone thickness along the time axis, as shown by a first dashed line 428. The second endpoint time $T_{E2}$ is calculated as the time that the projected thickness of the target region reaches the target characterizing value, e.g., target thickness $H_{TARGET}$. Similarly, the current polishing rate $k_4$ for the control zone, can be used to project a control zone thickness along the time axis, as shown by a second dashed line 430.

Similarly as described in the FIG. 4A, the controller 190 in FIG. 1A can determine the projected polishing thickness $H_{CONTROL}$ of the control zone at the second endpoint time $T_{E2}$ based on the fourth polishing rate $k_4$. Assuming that the control zone does not equal the target thickness $H_{TARGET}$ at the second endpoint time $T_{E2}$, the controller can calculate a second desired polishing rate $k_{D2}$, e.g., shown by the slope of the black dashed line 426, to bring the target zone and control zone to the target thickness at substantially the same time. The measured thickness of the control zone $H_{MEASURE}$ at the pressure change time $T_{P2}$, as shown in the FIG. 3C, can be used to calculate of the desired polishing rate $k_{D2}$ through the following equation:

$$k_{D2} = \frac{H_{MEASURE} - H_{TARGET}}{T_{P2} - T_{E2}}.$$

The controller can adjust a polishing parameter, e.g., the pressure in the chambers associated with the control zone, to change the current fourth polishing rate $k_4$ to the second desired polishing rate $k_{D2}$. Adjustments of chamber pressure in each chamber 146a, 146b and 146c to bring the polishing rate of the control zone to the desired polishing rate can be calculated using a Preston matrix associated with each conductive layer.

The controller 190 and its functional operations, such as the in-situ real time profile control algorithm, described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non transitory storage medium for execution by, or to control the operation of, data processing apparatus. Alternatively or in addition, the program instructions can be encoded on an artificially generated propagated signal, e.g., a computer-generated electrical, optical, or electromagnetic signal, that is generated to encode information for transmission to suitable receiver apparatus for execution by a data processing apparatus. The computer storage medium can be a computer-readable storage device, a computer-readable storage substrate, a random or serial access memory device, or a combination of one or more of them.

The term "data processing apparatus" refers to data processing hardware and encompasses all kinds of apparatus, devices, and machines for processing data, including by way of example a programmable digital processor, a digital computer, or multiple digital processors or computers. The apparatus can also be or further include special purpose logic circuitry, e.g., an FPGA (field programmable gate array) or an ASIC (application specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, a module, a software module, a script, or code, can be written in any form of programming language, including compiled or interpreted languages, or declarative or procedural languages, and it can be deployed in any form, including as a stand alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a data communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit). For a system of one or more computers to be "configured to" perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

Computers suitable for the execution of a computer program include, by way of example, can be based on general or special purpose microprocessors or both, or any other kind of central processing unit. Generally, a central processing unit will receive instructions and data from a read only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

Control of the various systems and processes described in this specification, or portions of them, can be implemented in a computer program product that includes instructions that are stored on one or more non-transitory computer-readable storage media, and that are executable on one or more processing devices. The systems described in this specification, or portions of them, can be implemented as an apparatus, method, or electronic system that may include one or more processing devices and memory to store executable instructions to perform the operations described in this specification.

When a component, e.g., a controller, circuit, etc., is described or claimed as "configured to" perform a task, this indicates that the component includes structure (e.g., processor and non-transitory computer readable media having instructions encoded therein, ASIC devices, circuitry hardware, etc.) that performs that task during operation, not merely that the component could be modified, e.g., programmed, to perform the task. The component can be said to be configured to perform the task even when the specified component is not currently operational (e.g., is not on).

A number of embodiments of the invention have been described. Nevertheless, it will be understood that various modifications may be made without departing from the spirit and scope of the invention.

For example, the monitoring system can be used in a variety of polishing systems. Either the polishing pad, or the carrier head, or both can move to provide relative motion between the polishing surface and the substrate. The polishing pad can be a circular (or some other shape) pad secured to the platen, a tape extending between supply and take-up rollers, or a continuous belt. The polishing pad can be affixed on a platen, incrementally advanced over a platen between polishing operations, or driven continuously over the platen during polishing. The pad can be secured to the platen during polishing, or there can be a fluid bearing between the platen and polishing pad during polishing. The polishing pad can be a standard (e.g., polyurethane with or without fillers) rough pad, a soft pad, or a fixed-abrasive pad.

Although the discussion above focuses on a polishing system, the techniques can be applied to other sorts of substrate processing systems, e.g., deposition or etching systems, that include an eddy current in-situ monitoring system.

In addition, although the discussion above focuses on driving the control zones to the same thickness, each zone can have a separate target thickness. In addition, rather than having a target zone and one or more control zones, the system could be configured to have a predetermined desired endpoint time, and to drive each zone to its target thickness at the desired endpoint time (so each zone is effectively a control zone).

Accordingly, other embodiments are within the scope of the following claims.

What is claimed is:

1. A computer program product for controlling polishing, comprising a non-transitory computer readable medium encoded with instructions to cause one or more processors to:

receive from an in-situ eddy current monitoring system a signal that includes a sequence of signal values;

calculate from the sequence of signal values a first sequence of thickness values for a first region of a substrate during polishing of an outer conductive layer of a first material having a first conductivity on the substrate, the first sequence of thickness values depending on thicknesses and conductivities of conductive layers in a stack of adjacent conductive layers on the substrate that includes the outer conductive layer and an adjacent underlying conductive layer of a second material having a different second conductivity, wherein calculation of the sequence of thickness values uses a correlation curve which receives as input each signal value from the sequence of signal values and, using a non-linear function of the signal values, returns a thickness value of the sequence of thickness values such that each thickness value represents a total thickness of the stack of adjacent conductive layers;

calculate a first polishing rate from the first sequence of thickness values, the first polishing rate being a rate of change of thickness of the stack of adjacent conductive layers;

calculate a first adjustment for a first polishing parameter based on the first polishing rate;

detect a first change in the first polishing rate that meets at least one first predetermined criterion that indicates removal of the outer conductive layer from regions over the underlying conductive layer and exposure of the underlying conductive layer in the stack;

in response to detecting the first change in the first polishing rate that indicates removal of the outer conductive layer, calculate from a portion of the sequence of signal values generated after exposure of the outer conductive layer a second sequence of thickness values for the first region of a substrate during polishing of the substrate, the second sequence of thickness values depending on thicknesses and conductivities of one or more remaining conductive layers in the stack that includes the adjacent underlying conductive layer;

calculate a second polishing rate from the second sequence of thickness values, the second polishing rate being a rate of change of thickness of the stack of the one or more remaining conductive layers; and calculate a second adjustment for the first polishing parameter based on the second polishing rate.

2. The computer program product of claim 1, wherein the instructions to calculate the first adjustment for the first polishing parameter include instructions to calculate a first projected time at which the first region reaches a target value based on the first polishing rate, and the instructions to calculate the second adjustment for the first polishing parameter include instructions to calculate a second projected time at which the first region reaches the target value based on the second polishing rate.

3. The computer program product of claim 2, comprising instructions to receive from the in-situ eddy current monitoring system a third sequence of thickness values for a second region of the substrate during polishing, calculate a third polishing rate from the third sequence of thickness values, receive from the in-situ eddy current monitoring system measuring a fourth sequence of thickness values for the second region of the substrate during polishing, and calculate a fourth polishing rate from the fourth sequence of thickness values.

4. The computer program product of claim 3, wherein the instructions to calculate the first adjustment for the first polishing parameter include instructions to calculate a first desired polishing rate for the second region based on the first polishing rate and the third polishing rate to bring the first region and the second region to the target value at substantially the same time, and the instructions calculate the second adjustment for the first polishing parameter includes instructions to calculate a second desired polishing rate for the second region based on the second polishing rate and the fourth polishing rate to bring the first region and the second region to the target value at substantially the same time.

5. The computer program product of claim 1, comprising instructions to iterate calculation of the first polishing rate and calculation of the first adjustment for the first polishing parameter prior to detecting the change in the first polishing rate at a first frequency, and instructions to iterate calculation of the second polishing rate and calculation of the second adjustment for the first polishing parameter are iterated after to detecting the change in the first polishing rate at a second frequency.

6. The computer program product of claim 5, wherein the first frequency is different from the second frequency.

7. The computer program product of claim 1, wherein the instructions to calculate the first adjustment for the first polishing parameter use a first matrix, and wherein the instructions to calculate the second adjustment for the first polishing parameter use a second matrix.

8. The computer program product of claim 7, wherein the first matrix and second matrix include different values for at least one element at the same row and column in the first matrix and second matrix.

9. The computer program product of claim 1, comprising instructions to, after detection of the first change in the polishing rate, detect a second change in the polishing rate that meets at least one second predetermined criterion that indicates exposure of a further layer below the underlying conductive layer.

10. The computer program product of claim 9, wherein the at least one first predetermined criterion and the at least one second predetermined criterion are different criteria.

11. The computer program product of claim 10, wherein one of the at least one first and at least one second predetermined criteria is a window logic having a bottom exit mode, and another of the at least one first and at least one second predetermined criteria is a window logic having a right side exit mode.

12. The computer program product of claim 11, wherein the instructions to calculate the first polishing rate use a first function and the instructions to calculate the second polishing rate use a different second function.

13. The computer program product of claim 12, wherein the first function and the second function use running windows of different duration.

14. The computer program product of claim 11, wherein the instructions to calculate the first adjustment for the first polishing parameter comprise instructions to limit the first adjustment to a first maximum change, and wherein the instructions to calculate the second adjustment for the first polishing parameter comprise instructions to limit the second adjustment to a different second maximum change.

15. The computer program product of claim 1, wherein the instructions to calculate the second polishing rate from the second sequence of thickness values use the same correlation curve based on the resistivity of the same layer from the stack of adjacent conductive layers.

16. The computer program product of claim 15, wherein the layer for the correlation curve is the last conductive layer from the stack of adjacent conductive layers.

17. The system of claim 1, wherein the correlation curve is based on the resistivity of a layer within the stack of adjacent conductive layers.

18. A method of controlling polishing, comprising:
polishing a stack of adjacent conductive layers on a substrate, the stack of adjacent conductive layers including an outer conductive layer and an underlying conductive layer;
generating with an in-situ eddy current monitoring system a signal that includes a sequence of signal values;
calculate from the sequence of signal values a first sequence of thickness values for a first region of the substrate during polishing, the thickness values depending on thicknesses and conductivities of the conductive layers in the stack including a thickness of the outer conductive layer undergoing polishing in the first region, wherein calculation of the sequence of thickness values uses a correlation curve which receives as input each signal value from the sequence of signal values and, using a non-linear function of the signal values, returns a thickness value of the sequence of thickness values such that each thickness value represents a total thickness of the stack of adjacent conductive layers;
calculating a first polishing rate from the first sequence of thickness values, the first polishing rate being a rate of change of thickness of the stack of adjacent conductive layers;
calculating a first adjustment for a first polishing parameter based on the first polishing rate;
detecting a first change in the polishing rate that meets at least one first predetermined criterion that indicates exposure of the underlying conductive layer;
upon detecting the change in the polishing rate, calculate from a portion of the sequence of signal values generated after exposure of the outer conductive layer a second sequence of thickness values for the first region of the substrate during polishing, the second sequence of thickness values depending on thicknesses and conductivities of remaining conductive layers in the stack including a thickness of the underlying conductive layer undergoing polishing;
calculating a second polishing rate from the second sequence of thickness values, the second polishing rate being a rate of change of thickness of the stack of the one or more remaining conductive layers; and
calculating a second adjustment for the first polishing parameter based on the second polishing rate.

19. A polishing system, comprising:
a platen to support a polishing pad;
a carrier head to hold a substrate;
a motor to generate relative motion between the platen and the carrier head;
an in-situ eddy current monitoring system to monitor the substrate during polishing of the substrate; and
a controller configured to
receive from the in-situ eddy current monitoring system a signal including a sequence of signal values;
calculate from the sequence of signal values a first sequence of thickness values for a first region of a substrate during polishing of the substrate, the first sequence of thickness values depending on thicknesses and conductivities of conductive layers in a stack of adjacent conductive layers on the substrate, wherein calculation of the sequence of thickness values uses a correlation curve which receives as input each signal value from the sequence of signal values and, using a non-linear function of the signal values, returns a thickness value of the sequence of thickness values such that each thickness value represents a total thickness of the stack of adjacent conductive layers;

calculate a first polishing rate from the first sequence of thickness values, the first polishing rate being a rate of change of thickness of the stack of adjacent conductive layers;

calculate a first adjustment for a first polishing parameter based on the first polishing rate;

detect a first change in the polishing rate that meets at least one first predetermined criterion that indicates exposure of an underlying conductive layer in the stack;

in response to detecting the first change in the polishing rate that indicates removal of the underlying conductive layer, calculate from a portion of the sequence of signal values generated after exposure of the underlying conductive layer a second sequence of thickness values for the first region of a substrate during polishing of the substrate, the second sequence of thickness values depending on thicknesses and conductivities of remaining conductive layers in the stack;

calculate a second polishing rate from the second sequence of thickness values, the second polishing rate being a rate of change of thickness of the stack of the one or more remaining conductive layers; and calculate a second adjustment for the first polishing parameter based on the second polishing rate.

20. The system of claim 19, wherein the carrier head comprises a plurality of independently controllable chambers, and the first polishing parameter is a pressure for one of the chambers.

* * * * *